(12) United States Patent
Yakushiji et al.

(10) Patent No.: US 10,406,890 B2
(45) Date of Patent: Sep. 10, 2019

(54) CIRCUIT ASSEMBLY HAVING VIBRATION-PROOF FIXING STRUCTURE FOR CIRCUIT COMPONENT, AND ELECTRIC COMPRESSOR FOR VEHICLE

(71) Applicant: MITSUBISHI HEAVY INDUSTRIES THERMAL SYSTEMS, LTD., Tokyo (JP)

(72) Inventors: Shunsuke Yakushiji, Tokyo (JP); Takayuki Takashige, Kiyosu (JP); Hiroto Higuchi, Kiyosu (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 16/068,760

(22) PCT Filed: Dec. 12, 2016

(86) PCT No.: PCT/JP2016/005111
§ 371 (c)(1),
(2) Date: Jul. 9, 2018

(87) PCT Pub. No.: WO2017/122246
PCT Pub. Date: Jul. 20, 2017

(65) Prior Publication Data
US 2019/0047371 A1 Feb. 14, 2019

(30) Foreign Application Priority Data
Jan. 13, 2016 (JP) .................. 2016-004239

(51) Int. Cl.
*B60H 1/32* (2006.01)
*F04B 39/00* (2006.01)
(Continued)

(52) U.S. Cl.
CPC ....... *B60H 1/3222* (2013.01); *B60H 1/00428* (2013.01); *B60H 1/3205* (2013.01);
(Continued)

(58) Field of Classification Search
CPC .............. B60H 1/3222; B60H 1/00428; B60H 1/3205; B60R 16/02; F04B 35/04; F04B 39/00
(Continued)

(56) References Cited

U.S. PATENT DOCUMENTS

2003/0143090 A1  7/2003  Iritani et al.
2016/0135320 A1  5/2016  Yakushiji et al.

FOREIGN PATENT DOCUMENTS

JP  2003-262187 A  9/2003
JP  2006-49556 A  2/2006
(Continued)

OTHER PUBLICATIONS

International Preliminary Report on Patentability and English translation of the Written Opinion of the International Searching Authority (forms PCT/IB/373, PCT/ISA/237 and PCT/IB/338), dated Jul. 26, 2018, for corresponding International Application No. PCT/JP2016/005111.

*Primary Examiner* — Tremesha S Willis
(74) *Attorney, Agent, or Firm* — Birch, Stewart, Kolasch & Birch, LLP.

(57) ABSTRACT

A circuit assembly (20) provided with: a circuit board (21); a capacitor (30) connected to the circuit board (21); and a circuit casing (20C) configured to house the circuit board (21) and the capacitor (30). The capacitor (30) is provided with: a component body (31) including a pair of connection terminals (32A and 33A) to be fixed to the circuit board (21); and a first fixing unit (41) and a second fixing unit (42) configured to fix the component body (31) to the circuit casing (20C) at both sides. The connection terminals (32A
(Continued)

and 33A) are disposed with a fixed line (L1) connecting the first fixing unit (41) and the second fixing unit (42) interposed therebetween, and both of the pair of connection terminals (32A and 33A) protrudes sideward from the component body (31) between a first surface of the circuit board (21) and the circuit casing (20C), and extends toward the circuit board (21). Distal ends (P2) of each of the connection terminals (32A and 33A) are fixed to the circuit board (21) in a vicinity of the first fixing unit (41).

14 Claims, 9 Drawing Sheets

(51) Int. Cl.

| | | |
|---|---|---|
| F04B 35/04 | (2006.01) | |
| H05K 1/02 | (2006.01) | |
| B60H 1/00 | (2006.01) | |
| B60R 16/02 | (2006.01) | |
| F04C 18/02 | (2006.01) | |
| F04C 29/00 | (2006.01) | |
| H05K 1/11 | (2006.01) | |
| H05K 1/18 | (2006.01) | |
| H05K 7/14 | (2006.01) | |
| H01G 2/06 | (2006.01) | |
| H01F 27/06 | (2006.01) | |

(52) U.S. Cl.
CPC .............. *B60R 16/02* (2013.01); *F04B 35/04* (2013.01); *F04B 39/00* (2013.01); *F04C 18/0215* (2013.01); *F04C 29/0085* (2013.01); *H05K 1/0271* (2013.01); *H05K 1/11* (2013.01); *H05K 1/181* (2013.01); *H05K 7/1427* (2013.01); *F04C 2240/803* (2013.01); *H01F 2027/065* (2013.01); *H01G 2/06* (2013.01); *H05K 1/18* (2013.01); *H05K 2201/1009* (2013.01); *H05K 2201/10015* (2013.01); *H05K 2201/1034* (2013.01); *H05K 2201/10295* (2013.01); *H05K 2201/10446* (2013.01)

(58) Field of Classification Search
USPC ........................................................ 361/748
See application file for complete search history.

(56) References Cited

FOREIGN PATENT DOCUMENTS

| | | |
|---|---|---|
| JP | 4690769 B2 | 6/2011 |
| JP | 2015-95611 A | 5/2015 |
| WO | WO 2015/045391 A1 | 4/2015 |

CIRCUIT ASSEMBLY HAVING VIBRATION-PROOF FIXING STRUCTURE FOR CIRCUIT COMPONENT, AND ELECTRIC COMPRESSOR FOR VEHICLE

TECHNICAL FIELD

The present invention relates to a circuit assembly provided with a vibration-proof fixing structure for a circuit component, such as a capacitor, and also to a vehicular electric compressor provided with the circuit assembly having the circuit component.

BACKGROUND ART

An electric compressor used in a vehicle air conditioner includes a circuit assembly that includes circuits for drive controlling a motor. The circuit assembly includes various circuit components, a circuit board to which the various circuit components are connected, and a circuit casing housing both the circuit components and the circuit board. The circuit casing is provided in a housing of the electric compressor.

The circuit components include relatively small components, such as switching elements and Integrated Circuit (IC) chips, and relatively large components, such as noise-cutting capacitors and coils.

In Patent Document 1, a capacitor is disposed below the circuit board in the circuit casing.

CITATION LIST

Patent Document

Patent Document 1: JP 2003-262187 A

SUMMARY OF THE INVENTION

Problem to be Solved by the Invention

A circuit component provided in a vehicle is exposed to a severe vibration environment in which the circuit component is affected by engine vibrations, road surface vibrations, and the like.

An object of the present invention is to provide a circuit assembly that includes a vibration-proof fixing structure sufficient for preventing damage to a circuit component and a circuit board even under a severe vibrating environment, and a vehicular electric compressor.

Means for Solving the Problem

A circuit assembly of the present invention includes: a circuit board; a circuit component connected to the circuit board; and a casing configured to house the circuit board and the circuit component.

The circuit component includes a component body including a pair of connection terminals to be fixed to the circuit board; and a first fixing portion and a second fixing portion configured to fix the component body to the casing at both sides.

In the present invention, the pair of connection terminals are disposed with a fixed line connecting the first fixing portion and the second fixing portion interposed therebetween, the pair of connection terminals project sideward from the component body between a first surface of the circuit board and the casing and extend toward the circuit board, and distal ends of the pair of connection terminals are fixed to the circuit board in a vicinity of at least one of the first fixing portion and the second fixing portion.

In a circuit assembly of the present invention, the pair of connection terminals are preferably disposed along a direction orthogonal to the fixed line in the vicinity of at least one of the first fixing portion and the second fixing portion.

In the circuit board of the present invention, the pair of connection terminals are disposed along the direction orthogonal to the fixed line, one of the pair of connection terminals is preferably positioned in the vicinity of one of the first fixing portion and the second fixing portion, and the other of the pair of connection terminals is preferably positioned in the vicinity of the other of the first fixing portion and the second fixing portion.

In a circuit assembly of the present invention, the pair of connection terminals are preferably disposed such that a longitudinal direction of a lateral cross section is set along the direction orthogonal to the fixed line connecting the first fixing portion and the second fixing portion.

In a circuit assembly of the present invention, at least one of the first fixing portion and the second fixing portion is preferably fixed to the casing without the circuit board interposed therebetween.

In a circuit assembly of the present invention, the component body is preferably positioned in the vicinity of an area where the circuit board is fixed to the casing.

In a circuit assembly of the present invention, the first fixing portion and the second fixing portion are preferably at different height positions in a direction orthogonal to the circuit board along a plate thickness direction.

The present invention provides an electric compressor to be mounted on a vehicle, the present invention including the circuit assembly; a motor to which a driving current is supplied from the circuit assembly; and a compression mechanism configured to compress a fluid by motive power transmitted from the motor.

Effect of Invention

According to the present invention, the connection terminals are fixed to the circuit board in the vicinity of the fixing portions, so that vibration amplitude of the circuit component is small at positions where the connection terminals are fixed to the circuit board. Therefore, the connection terminals and the circuit board are prevented from being subjected to an excessive load, and thus damages to the connection terminals and the circuit board can be prevented.

Furthermore, by disposing the pair of connection terminals with the fixed line connecting the first fixing portion and the second fixing portion interposed therebetween or by differentiating the height of the first fixing portion from the height of the second fixing portion, rigidity is enhanced, and prevention of damage to the circuit component or the circuit board can be ensured.

DESCRIPTION OF THE PREFERRED EMBODIMENTS

Embodiments of the present invention will be described hereinafter with reference to the appended drawings.

Figure 1:
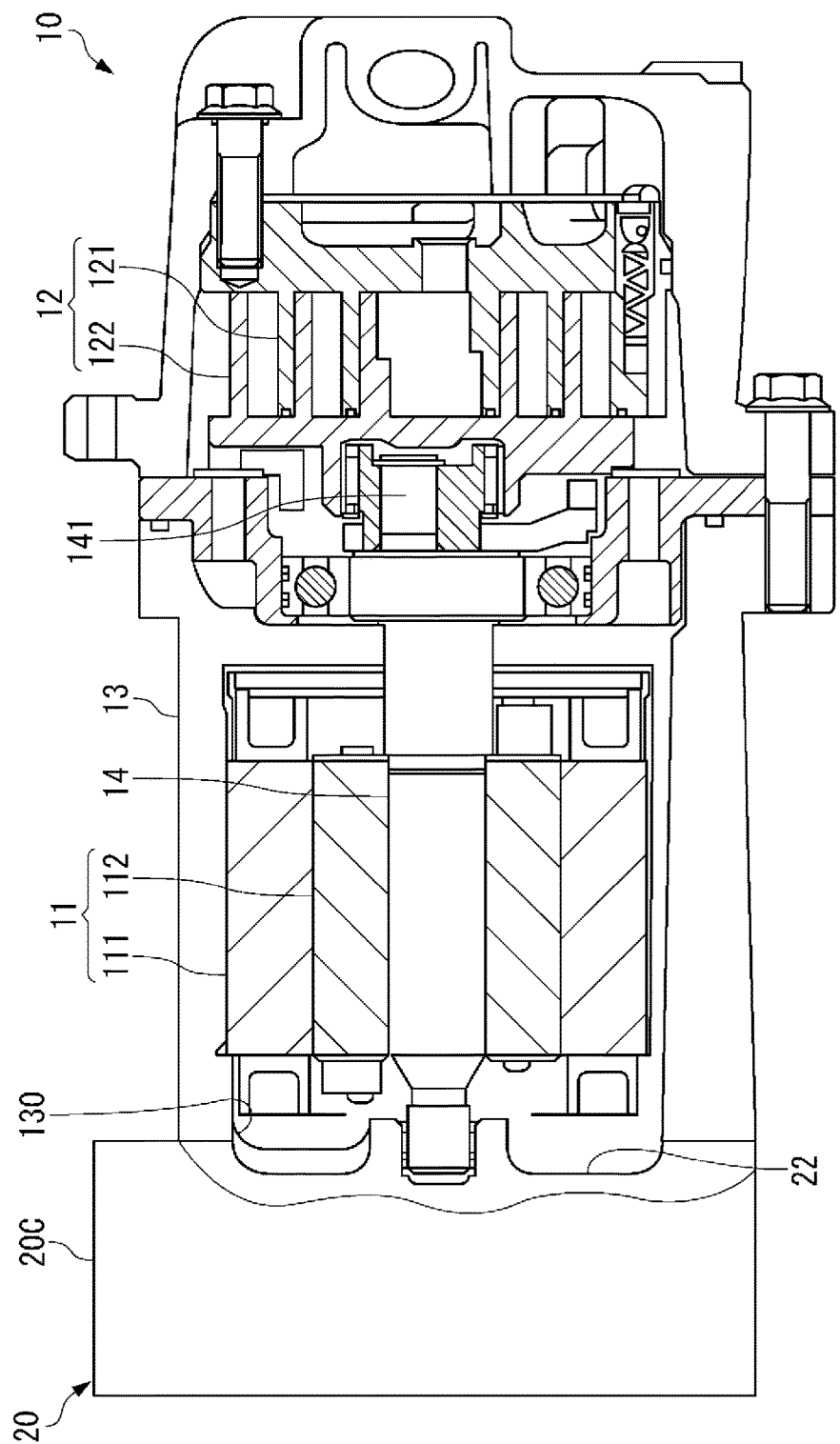
FIG. 1 is a vertical cross-sectional view illustrating a vehicular electric compressor according to an embodiment of the present invention.

The electric compressor 10 as illustrated in FIG. 1 is provided with a motor 11, a compression mechanism 12, a housing 13 configured to house the motor 11 and the compression mechanism 12, and a circuit assembly 20 having a circuit for drive controlling the motor 11.

An electric compressor 10 constitutes an air conditioner mounted in a vehicle.

The motor 11 includes a stator 111 fixed to the housing 13 and a rotor 112 that rotates relative to the stator 111.

A shaft 14 is coupled to the rotor 112.

The compression mechanism 12 includes a fixed scroll 121 fixed to the housing 13 and an orbiting scroll 122 that revolves relative to the fixed scroll 121.

The orbiting scroll 122 is coupled to an eccentric pin 141 provided at an end of the shaft 14.

The housing 13 is formed in a cylindrical shape having an axis along the shaft 14.

The housing 13 is mounted on an engine of a vehicle by a bracket (not illustrated). At this time, the shaft 14 is disposed horizontally.

The electric compressor 10 operates in the following manner.

When a three phase drive current is supplied to the stator 11 of the motor 11 by the circuit assembly 20, the motor 11 is driven, and the shaft 14 is caused to rotate by a rotational driving force output from the motor 11. When the orbiting scroll 122 is caused to turn as a result of a transmission of the rotation of the shaft 14, a refrigerant inside the housing 13 is sucked into a compression chamber between the fixed scroll 121 and the orbiting scroll 122. The compression mechanism 12 compresses the refrigerant as a result of a reduction in capacity of the compression chamber caused by turning of the orbiting scroll 122, and discharges the compressed refrigerant to a refrigerant circuit (not illustrated).

Next, a configuration of the circuit assembly 20 will be described.

Figure 2:
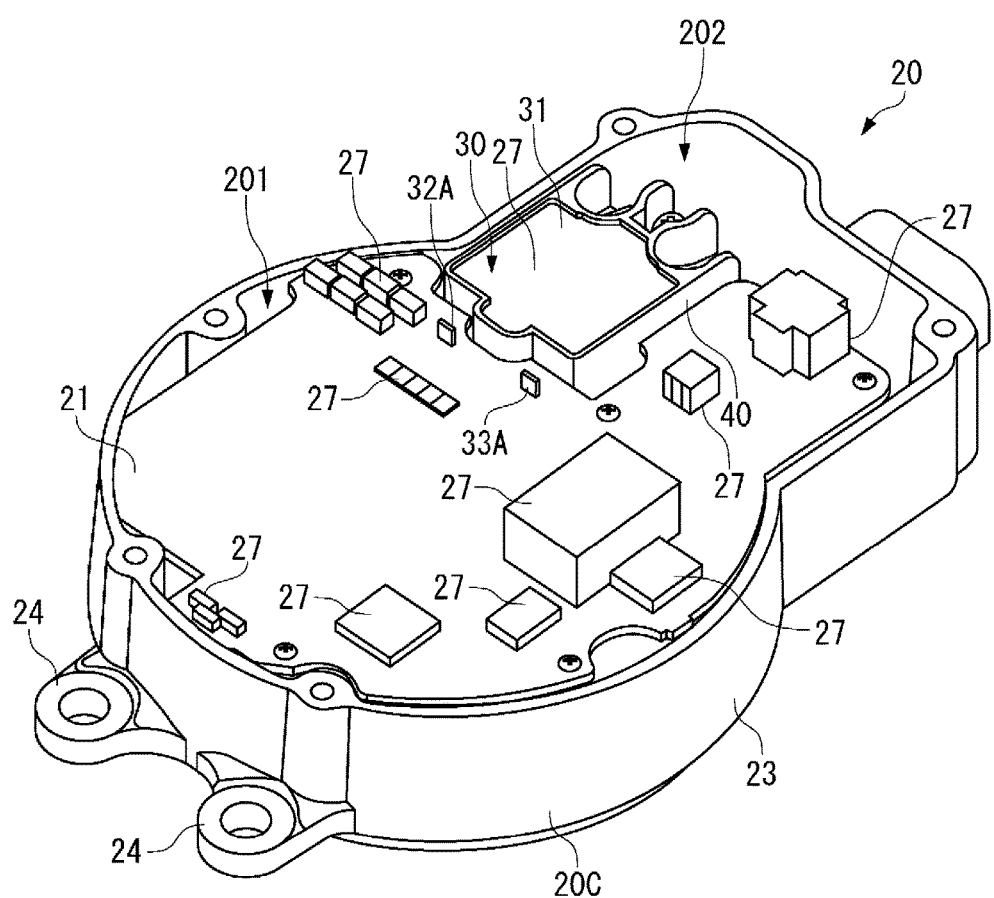
FIG. 2 is a perspective view illustrating a circuit casing, a circuit board, and a capacitor.

As illustrated in FIG. 2, the circuit assembly 20 is provided with a circuit board 21, circuit components such as a capacitor 30 connected to the circuit board 21, and a circuit casing 20C configured to house the circuit board 21 and the capacitor 30.

The circuit assembly 20 is integrated with the housing 13 (FIG. 1).

The circuit casing 20C is provided with a partition wall 22 (FIG. 1, FIG. 3) configured to partition an interior of the housing 13 and an interior of the circuit assembly 20, a peripheral wall 23 extending upright from a peripheral edge of the partition wall 22, a fixing portion 24 to be secured to the housing 13, and a lid (not illustrated).

The circuit casing 20C closes an opening 130 (FIG. 1) formed at a first end portion side of the housing 13. A portion between a peripheral edge of the opening 130 and the circuit casing 20C is sealed with a seal member (not illustrated).

The partition wall 22 is provided with a plurality of bosses 25, 26 (FIG. 3) extending upright therefrom. The circuit board 21 and the capacitor 30 are secured to the bosses 25, 26.

The peripheral wall 23 surrounds the circuit board 21 and the capacitor 30. The lid (not illustrated) is fixed to a distal end of the peripheral wall 23.

As illustrated in FIG. 2, a housing space including a cylindrical space 201 corresponding to a shape of the housing 13 (FIG. 1) and a rectangular shaped space 202 continuous to the space 201 is provided inside the circuit casing 20C.

The circuit board 21 is disposed substantially over an entire region of the circuit casing 20C except for a region required for installing the capacitor 30.

The circuit board 21 is fixed to bosses 26 (FIG. 3) of the circuit casing 20C at a plurality of areas with screws. Fixed areas of the circuit board 21 to be fixed to the bosses 26 exist also in the vicinity of the capacitor 30. FIG. 4 illustrates holes 211 in the circuit board corresponding to the bosses 26 in FIG. 3.

A drive circuit configured to inverter-control the motor 11 includes various circuit elements 27 provided on the circuit board 21 (illustrated only partly in FIG. 2) and the capacitor 30.

The drive circuit raises a direct current supplied from a battery (not illustrated), and generates and outputs a three-phase alternating current supplied to the motor 11 by a switching operation.

The switching element is hidden under the circuit board 21 illustrated in FIG. 2. The switching element is preferably disposed on the partition wall 22 which comes into contact with the refrigerant inside the housing 13 in a manner allowed for thermal conduction for heat radiation. The switching element may also be fixed to the partition wall 22 with screws of the like.

The capacitor 30 is used for reducing noises generated by the switching operation. A coil may be provided in addition to the capacitor 30.

The circuit component which is large and heavy compared with the circuit elements 27 provided on the circuit board 21, similar to the capacitor 30, is fixed to the circuit casing 20C.

The capacitor 30 is disposed at a corner of the rectangular shaped space 202 in the circuit casing 20C, and is fixed to bosses 25 (FIG. 3) on the circuit casing 20C.

The capacitor 30 is mechanically fixed to the circuit casing 20C, and is electrically connected to the circuit board 21.

In a case where there are any circuit components which are not mounted on the circuit board 21 in addition to the capacitor 30, the corresponding circuit components may be disposed under the circuit board 21 and fixed to the circuit casing 20C.

As the electric compressor 10 is mounted on a vehicle, the circuit assembly 20 is exposed to specifically severe vibration environment.

Examples of a vibration source include vehicle engines, vibrations caused by irregularity of road surfaces, traveling motors provided on electric vehicles and hybrid vehicles, drive systems configured to drive wheels by transmitting driving forces output from motive power sources such as engines or motors, and the compression mechanism 12 and the like of the electric compressor 10.

Damages to the circuit board 21 and the capacitor 30 need to be prevented even when the circuit board 21, the capacitor 30, and the circuit casing 20C are excited by vibrations transmitted from these vibration sources.

The present embodiment is provided with a vibration-proof fixing structure described below for securing sufficient vibration resistance of the capacitor 30.

First, a configuration of the capacitor 30 will be described with reference to FIG. 5 to FIG. 7.

The capacitor 30 includes a component body 31, and a capacitor casing 40 configured to house the component body 31.

The component body 31 includes an power storage unit 31A (FIG. 6) configured to store electric charge, a substantially cuboid shaped resin mold 31B (FIG. 5) configured to cover the power storage unit 31A, and two terminal members 32, 33 (FIG. 6) provided on the power storage unit 31A.

The terminal members 32, 33 (FIG. 6) are formed by punching and bending a plate material. The terminal members 32, 33 have a rectangular shaped cross section.

The terminal member 32 includes a connection terminal 32A which is a positive electrode (or a negative electrode) leading out from an interior of the power storage unit 31A and connected to the circuit board 21, and a terminal 32B connected to an element (not illustrated) which constitutes a drive circuit.

The terminal member 33 includes a connection terminal 33A which is a negative electrode (or a positive electrode) leading out from the interior of the power storage unit 31A and connected to the circuit board 21, and a terminal 33B connected to an element (not illustrated) which constitute a drive circuit.

Figure 5:
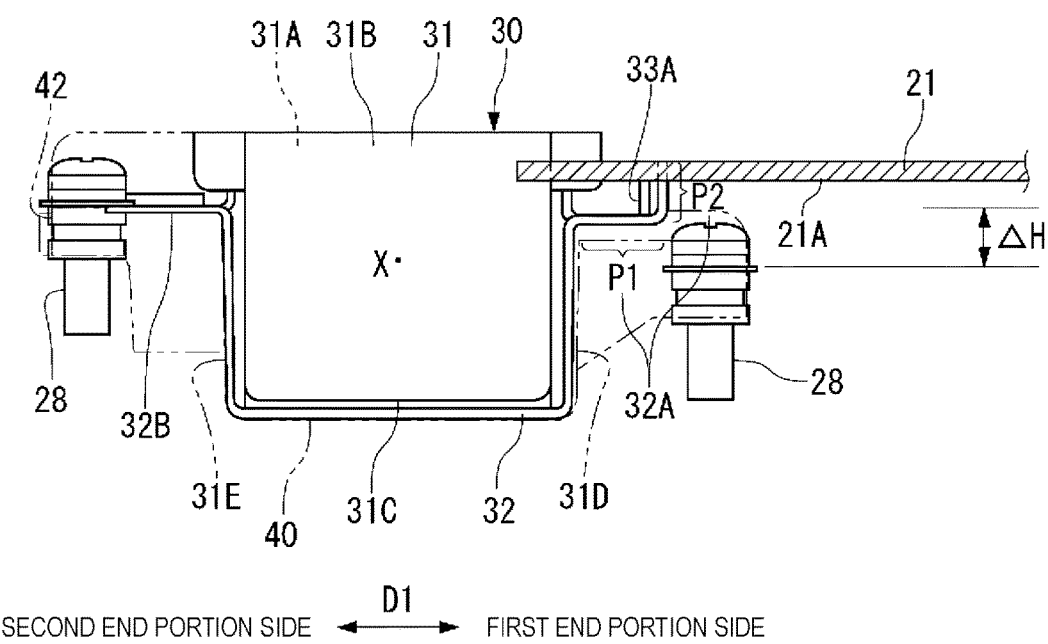
FIG. 5 is a side view illustrating the capacitor and the circuit board.
Figure 6:
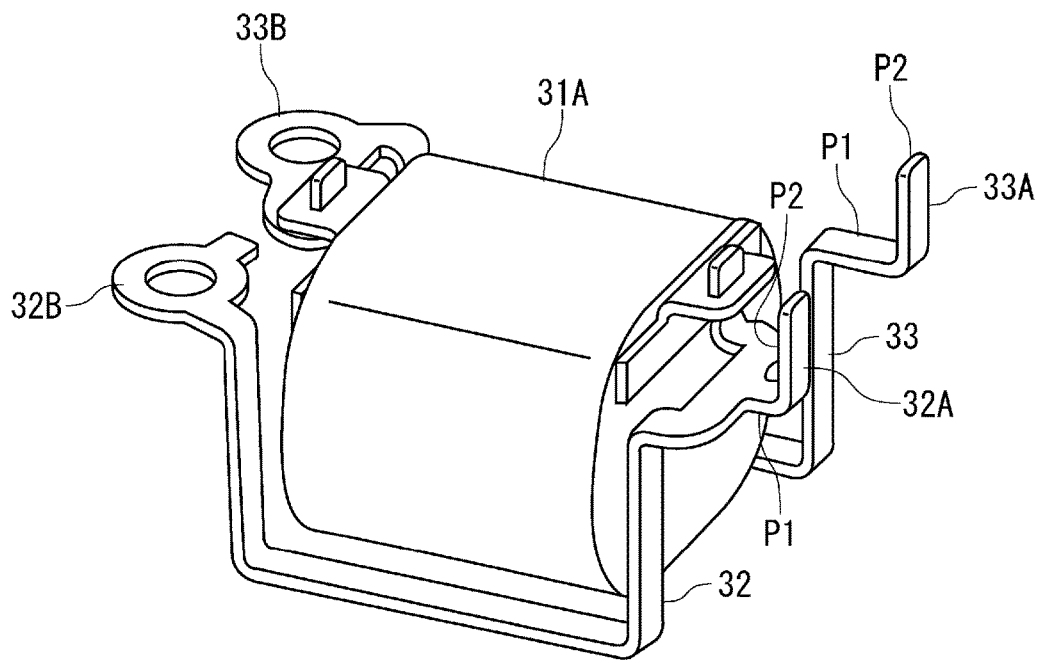
FIG. 6 is a perspective view illustrating a terminal member of the capacitor.

As illustrated in FIG. 5 and FIG. 6, the terminal member 32 is drawn out from the first end portion side through a bottom surface 31C of the component body 31 to a second end portion side in a width direction D1 of the capacitor 30 and, in contrast to the terminal member 32, the terminal member 33 is drawn out from the second end portion side of the component body 31 through the bottom surface 31C of the component body 31 to the first end portion side.

Figure 7:
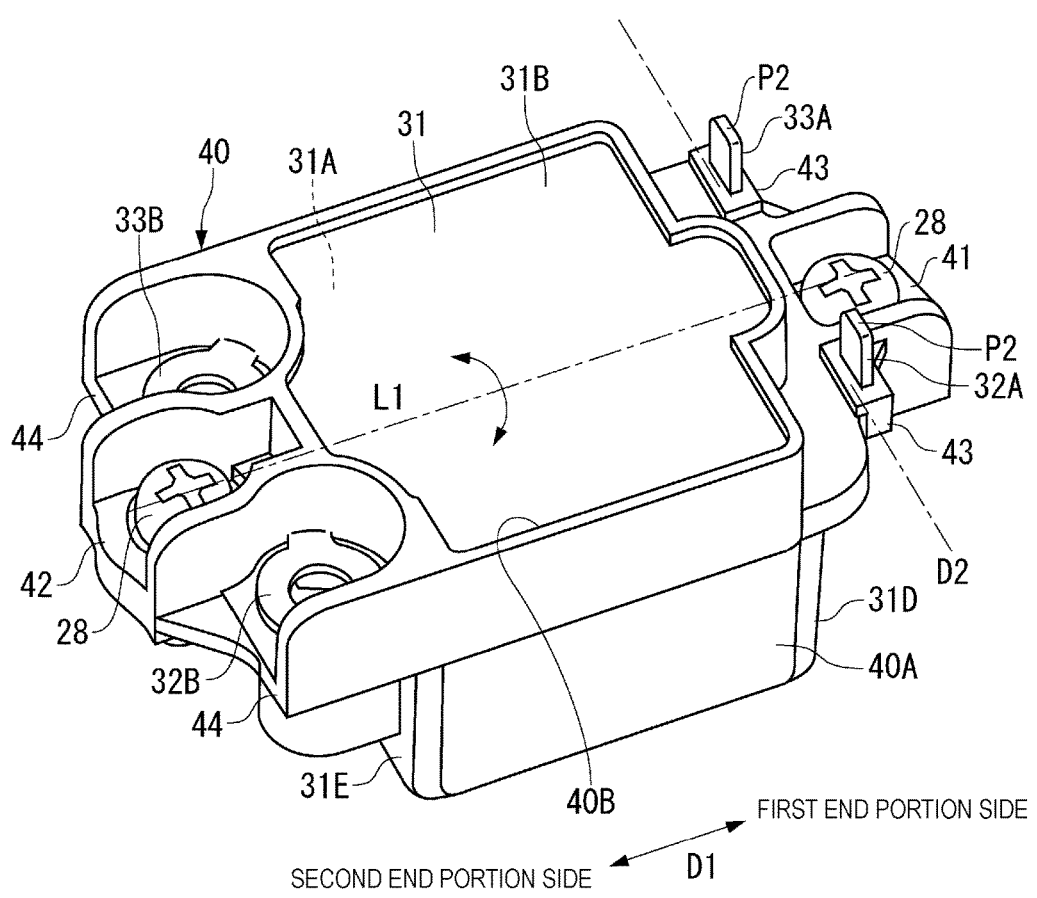
FIG. 7 is a perspective view illustrating a single capacitor.

As illustrated in FIG. 7, a pair of connection terminals 32A, 33A are positioned on the first end portion side of the component body 31, and a pair of terminals 32B, 33B are positioned on the second end portion side of the component body 31.

As illustrated in FIG. 5 and FIG. 6, the connection terminals 32A, 33A each include a protruding portion P1 projecting sideward from the component body 31 directly below the circuit board 21, and distal end P2 continuing from the projecting portion P1 and extending toward the circuit board 21. The distal end P2 is bent with respect to the projecting portion P1.

As illustrated in FIGS. 5 and 6, the terminals 32B and 33B project sideward from the component body 31 where the circuit board 21 is not present and form an annular shape as illustrated in FIG. 6 and FIG. 7.

As illustrated in FIG. 7, the capacitor casing 40 includes a housing portion 40A configured to house the power storage unit 31A and a resin mold 31B via an opening 40B, and a first fixing portion 41 and a second fixing portion 42 provided on both sides of the housing portion 40A.

The capacitor casing 40 is formed integrally from a resin having insulating property.

The housing portion 40A is formed into a substantially cuboid box shape.

The power storage unit 31A and the resin mold 31B are fitted or press-fitted into the housing portion 40A.

The capacitor casing 40 includes retaining portions 43, 43 configured to retain the connection terminals 32A. 33A, and retaining portions 44, 44 configured to retain the terminals 32B, 33B.

The terminals 32B, 33B are in contact conduction with other annular shaped terminals (not illustrated) overlapped with the terminals 32B, 33B through metal screws (not illustrated) inserted into the retaining portion 44.

As illustrated in FIG. 7, the respective distal ends P2 of the connection terminals 32A, 33A project from the retaining portion 43.

The respective distal ends P2 are electrically connected to a terminal pattern (not illustrated) provided on the circuit board 21 (FIG. 4), and is mechanically fixed to the circuit board 21.

The distal ends P2 of the present embodiment penetrate through the circuit board 21 in a thickness direction via a hole 210 formed in the circuit board 21, and the distal ends P2 and the terminal pattern of the circuit board 21 are mechanically fixed and electrically connected by being joined with solder (not illustrated).

The first fixing portion 41 and the second fixing portion 42 are tightly fixed to the bosses 25 (FIG. 3) of the circuit casing 20C by screws 28. The component body 31 is fixed to the circuit casing 20C at both sides thereof by the first fixing portion 41 and the second posting portion 42. The first fixing portion 41 and the second fixing portion 42 each include holes allowing for insertion of the screws 28.

The first fixing portion 41 and the second fixing portion 42 support the component body 311 on both sides with a position of center of gravity of the component body 31 interposed therebetween.

Figure 3:
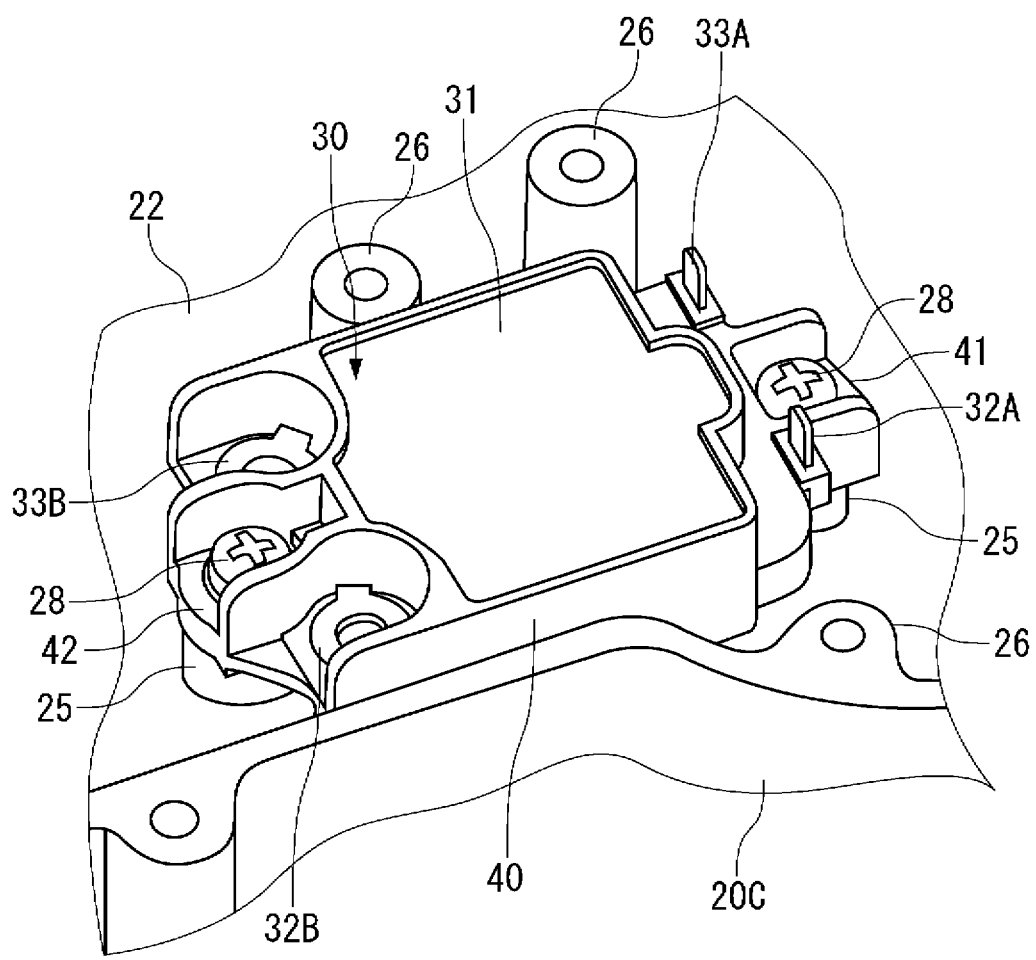
FIG. 3 is a perspective view illustrating the capacitor fixed to the circuit casing.
Figure 4:
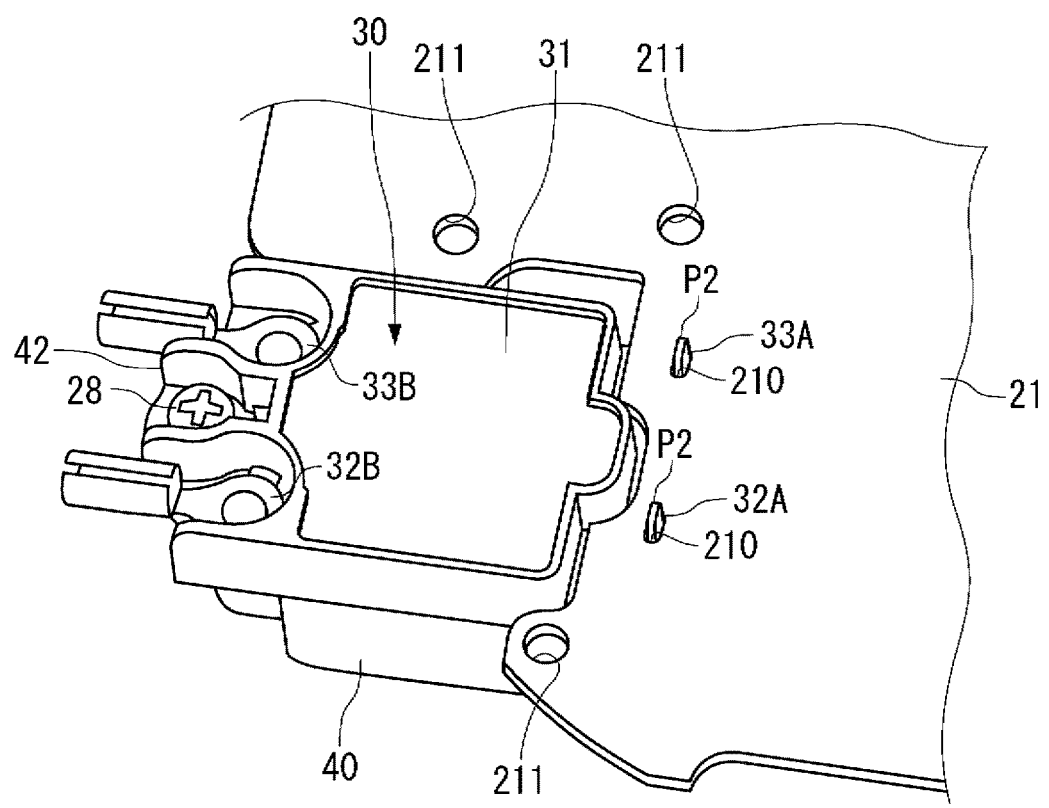
FIG. 4 is a perspective view illustrating the capacitor and the circuit board.

As illustrated in FIG. 3, the circuit board 21 is not interposed between the first fixing portion 41 and the bosses 25. The same applies to between the second fixing portion 42 and the bosses 25. In other words, the first fixing portion 41 and the second posting portion 42 are fixed to the circuit casing 20C without the circuit board 21 interposed therebetween.

In the present embodiment, the first and second fixing portions 41, 42 are not fastened together with the circuit board 21, and thus vibration of the circuit board 21 is not input into the first and second fixing portions. Therefore, an input of vibration from the circuit board 21 to the capacitor 30 is restricted, which contributes to prevention of damage to the connection terminals 32A, 33A, the first and second fixing portions 41, 42, and the circuit board 21 caused by relative vibration between the capacitor 3 and the circuit board 21.

As illustrated in FIG. 7, the first fixing portion 41 is located on the first end portion side in the width direction D1 of the capacitor 30 and the second fixing portion 42 is positioned on the second end portion side in the width direction D1 of the capacitor 30.

The first fixing portion 41 is positioned between the retaining portions 43, 43 configured to retain the connection terminals 32A, 33A and project sideward from a side surface 31D of the capacitor 30 to positions beyond the retaining portions 43, 43.

The connection terminals 32A, 33A are positioned in the vicinity of the first fixing portion 41.

The second fixing portion 42 is positioned between the retaining portions 44, 44 configured to retain the terminals 32B, 33B and project sideward from a side surface 31E of the capacitor 30 to positions beyond the retaining portions 44, 44.

The terminals 32B, 33B are positioned in the vicinity of the second fixing portion 42.

Basic characteristic of the present embodiment includes the connection terminals 32A, 33A being fixed to the circuit board 21 in the vicinity of the first fixing portion 41 fixed to the circuit casing 20C. This relates to a configuration of the connection terminals 32A, 33A.

Figure 8:
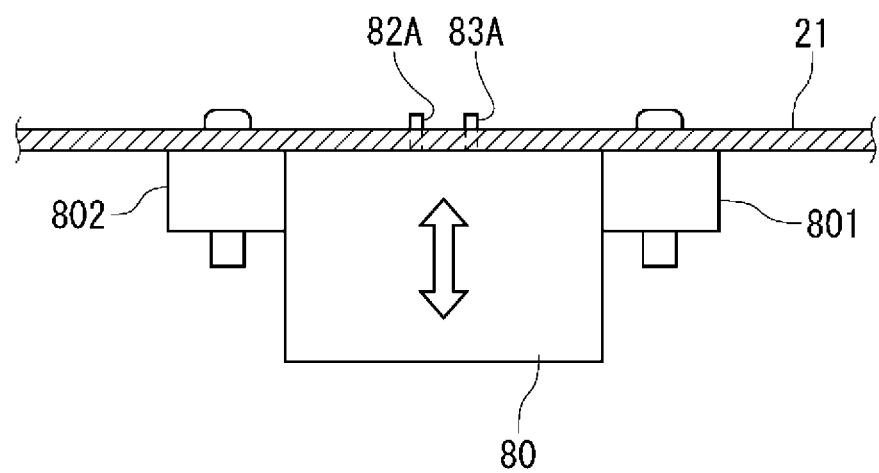
FIG. 8 is a drawing illustrating a typical example.

As illustrated in FIG. 8, typical connection terminals 82A, 83A project linearly upward from an upper end of a capacitor 80 facing the circuit board 21. In this case, the connection terminals 82A, 83A are fixed to the circuit board 21 at positions far from fixing portions 801, 802 fixed to a circuit casing (not illustrated).

In contrast, when being drawn out sideward from the component body 311 as the connection terminals 32A, 32A of the present embodiment (FIG. 5), the connection terminals 32A. 33A can be fixed to the circuit board 21 in the vicinity of the first fixing portion 41 located sideward of the component body 31.

When being drawn out sideward from the component body 31, the connection terminals 32A. 33A are not present above the capacitor 30, and thus a space for soldering is not necessary above the capacity 30, as a result, the capacity of the capacitor 30 may be secured to an upper limit in height in the circuit casing 20C (position of a lid). As illustrated in FIG. 5, an upper end portion of the capacitor 30 of the present embodiment projects upward from the circuit board 21 adjacent thereto.

As illustrated in FIG. 7, the connection terminals 32A, 33A are disposed in the vicinity of the first fixing portion 41 with a line connecting the first fixing portion and the second fixing portion 52 (hereinafter, referred to as fixed line L1) interposed therebetween, and are symmetrical with respect to a fixed line L1.

As illustrated in FIG. 5, the first fixing portion 41 and the second fixing portion 42 are at different positions in the direction orthogonal to the circuit board 21 (height direction) along the plate thickness direction.

Specifically, the second fixing portion 42 exposed without being hidden by the circuit board 21 is at a position higher than the first fixing portion 41 positioned on the inner side (the side of the partition wall 22) of the circuit board 21. A difference between the height of the first fixing portion 41 and the height of the second fixing portion 42 is indicated by ΔH.

The height of the first fixing portion 41 is substantially the same as a height of the protruding portions P1 of the connection terminals 32A, 33A.

The height of the second fixing portion 42 is substantially the same as a height of the circuit board 21.

Note that even when the first fixing portion 41 is located at a position higher than the second fixing portion 42 unlike the present embodiment, it is allowed as long as the screws 28 can be fixed.

An operational effect of the circuit assembly 20 of the present embodiment will be described.

First, a state of vibration of the capacitor 30 will be described.

When the capacitor 30 is fixed on both sides by the first fixing portion 41 and the second fixing portion 42, a vibration amplitude of the capacitor 30 around a central portion far from the first and second fixing portions 41, 42 is larger than a vibration amplitude at positions where the first and second fixing portions 41, 42 are fixed. The same applies to the capacitor 80 of a typical example illustrated in FIG. 8.

In the typical example (FIG. 8), the connection terminals 82A, 83A are fixed to the circuit board 21 at a central portion of the capacitor 80 far from the fixing portions 801, 802. As the vibration amplitude of the capacitor 80 is large at positions where the connection terminals 82A, 83A are fixed to the circuit board 21 (see arrow), relative displacement between the circuit board 21 and the capacitor 80 is large.

In contrast, in the present embodiment (FIG. 5), the connection terminals 32A, 33A are fixed to the circuit board 21 in the vicinity of the first fixing portion 41, out of the first fixing portion 41 and the second fixing portion 42. As the vibration amplitude of the capacitor 30 is small at positions where the connection terminals 32A, 33A are fixed to the circuit board 21, relative displacement between the circuit board 21 and the capacitor 30 is small. Therefore, the connections 32A, 33A and the circuit board 21 are prevented from being subjected to an excessive load, and thus damages to the connection terminals 32A, 33A and the circuit board 21 can be prevented.

Therefore, according to the present embodiment, a sufficient vibration resistance can be secured in order to prevent damages to the capacitor 30 and the circuit board 21 even under severe vibration environments.

In addition, in the present embodiment, a configuration relating to a position of the capacity 30 inside the circuit casing 20C can also improve the vibration resistance.

The capacitor 30 is disposed in the vicinity of the bosses 26 to which the circuit board 21 is fixed (FIG. 3) inside the circuit casing 20C. Accordingly, the connection terminals 32A, 33A of the capacitor 30 are fixed to a portion of the circuit board 21 having a small vibration amplitude due to fixation, which contributes to prevention of damage to the connection terminals 32A, 33A, the circuit board 21, the first fixing portion 41, and second fixing portion 42 which may be caused by relative vibration between the capacitor 30 and the circuit board 21.

In addition to the configuration described above, the following configuration is preferably employed to improve vibration resistance.

Configurations (1) to (3) employed in the present embodiment are listed below.

(1) First, as illustrated in FIG. 7, the connection terminals 32A, 33A are disposed with the fixed line L1 connecting the first fixing portion 41 and the second fixing portion 42 interposed therebetween and the connection terminals 32A. 33A are fixed to the circuit board 21 on both sides of the fixed line L1, and thus, rigidity in a direction of falling of the capacitor 30 (see arrow) about the fixed line L1 is improved. Therefore, a natural frequency f can be increased for improving a spring constant K corresponding to the rigidity and for avoiding resonance (see basic equations below).

In order to improve rigidity in the direction of falling about the fixed line L1, it is the most preferable that the connection terminals 32A, 33A are arranged along a direction orthogonal to the fixed line L1.

The improvement in rigidity in the direction of falling of the capacitor 30 contributes prevention of damages to the first and second fixing portions 41, 42, the connection terminals 32A, 33A, and the circuit board 21.

$$f = \frac{1}{2\pi}\sqrt{\frac{K}{M}}$$ [Equation 1]

f: Natural frequency
M: Mass
K: Spring constant (2) Subsequently, the connection terminals 32A, 33A of the present embodiment have a rectangular shaped cross section, and as illustrated in FIG. 7, a long side of the cross section extends along a direction D2 orthogonal to the fixed line L1. In other words, the longitudinal direction of the cross sections of the connection terminals 32A, 33A is set to extend along the direction orthogonal to the fixed line L1.

Accordingly, as secondary moment of the cross sections of the connection terminals 32A. 33A increases about an axis of the fixed line L1, rigidity of the capacitor 30 including the connection terminals 32A, 33A increases.

(3) As illustrated in FIG. 5, rigidity in the direction of falling of the capacity 30 is improved also by the capacitor 30 being fixed to the circuit casing 20C at different heights by the first fixing portion 41 and the second fixing portion 42.

In addition, the first fixing portion 41 and the second fixing portion 42 are preferably disposed with a center of gravity X of the capacitor 30 interposed therebetween. In this configuration, an excitation force acting on the center of gravity X by the first fixing portion 41 and the second fixing portion 42 may be maintained in a well-balanced manner Thus, rigidity can be improved.

According to the configurations (1) to (3) described above, rigidity in a direction of falling of the capacitor 30 can be increased without increasing the number of fixing portions, or without improving the rigidity by increasing plate thicknesses of the fixing portions 41, 42.

One or more of the above-described configurations (1) to (3) may be appropriately selected and employed.

Figure 9A:
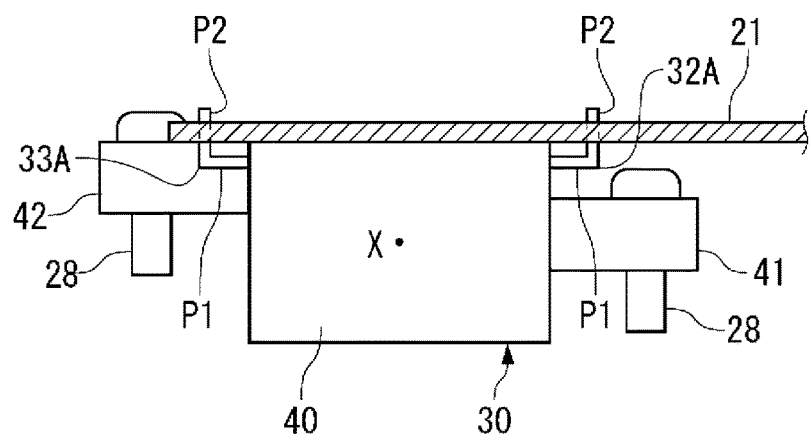
FIGS. 9A and 9B are drawings illustrating modifications of the present invention.

FIG. 9A is a drawing illustrating a modification of the present invention.

In FIG. 9A, the connection terminal 32A is positioned in the vicinity of the first fixing portion 41 and the connection terminal 33A is positioned in the vicinity of the second fixing portion 42. The distal end P2 of the connection terminal 32A is fixed to the circuit board 21 in the vicinity of the first fixing portion 41, and the distal end P2 of the connection terminal 33A is fixed to the circuit board 21 in the vicinity of the second fixing portion 42.

In the same manner as the above-described embodiment, the connection terminals 32A, 33A are disposed to extend along the direction orthogonal to the fixed line L1.

In the configuration as illustrated in FIG. 9A, basically, the connection terminal 32A is fixed to the circuit board 21 in the vicinity of the first fixing portion 41 fixed to the circuit casing 20C and, likewise, the connection terminal 33A is fixed to the circuit board 21 in the vicinity of the second fixing portion 42 fixed to the circuit casing 20C.

As a result of this basic configuration, as the vibration amplitude of the capacitor 30 is small at positions where the connection terminals 32A, 33A are fixed to the circuit board 21, relative displacement between the circuit board 21 and the capacitor 30 is small in the same manner as the above-described embodiment. Therefore, the connections 32A, 33A and the circuit board 21 are prevented from being subjected to an excessive load, and thus damages to the connection terminals 32A. 33A and the circuit board 21 are prevented.

In FIG. 9A, the connection terminal 32A and the connection terminal 33A are disposed with the center of gravity X of the capacity 30 interposed therebetween. The same applies to the first fixing portion 41 and the second fixing portion 42.

In this configuration, an excitation force acting on the center of gravity X by the first fixing portion 41 and the connection terminal 32A, and the second fixing portion 42 and the connection terminal 33A can be maintained in a well-balanced manner. Thus, rigidity can be improved.

Figure 9B:
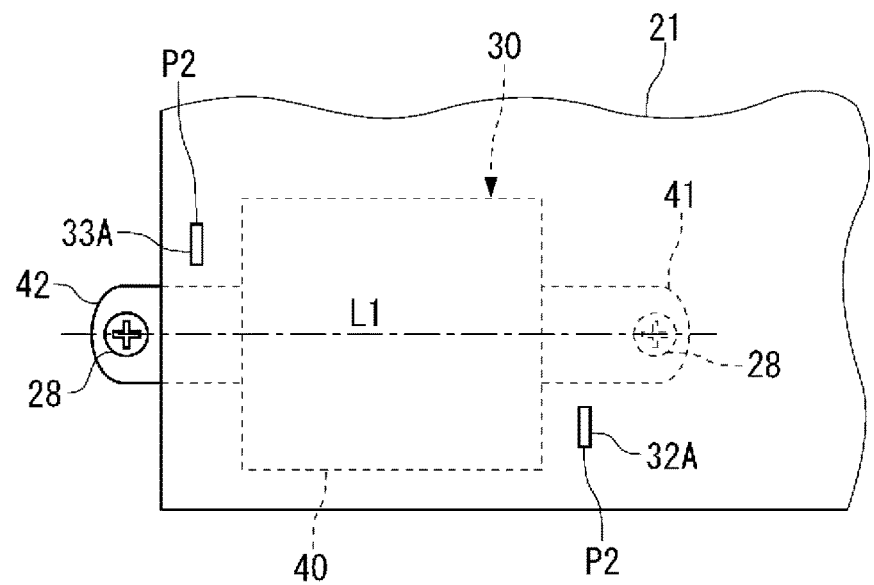

In addition, as illustrated in FIGS. 9A and 9B, it is preferable to improve rigidity of the capacitor 30 in the direction of falling by applying the configurations (1) to (3) described above.

Besides the above-described embodiments, as long as there is no departure from the spirit and scope of the present invention, configurations explained in the above-described embodiments can be selected as desired, or can be changed to other configurations as necessary.

The position of the capacitor 30 inside the circuit casing 20C is not limited to the embodiment described above, and the entire capacity 30 may be disposed under the base plate 21. In this case, both of the first fixing portion 41 and the second fixing portion 42 are disposed between the first surface 21A (FIG. 5) of the circuit board 21 and the partition wall 22.

In the present invention, a configuration in which one or both of the first fixing portion 41 and the second fixing portion 42 are fixed to bosses of the circuit casing 20C together with the circuit board 21 with the same screws 28 is also allowed.

The number of the connection terminals 32A, 33A drawn out sideward from the capacitor 30 and fixed to the circuit board 21 is not particularly limited thereto. The circuit component of the present invention include any configuration as long as one or more connection terminal is provided and a connection terminal is fixed to a circuit board in a vicinity of a fixing portion.

The number of the fixing portion is not limited thereto. Provision of additional fixing portion configured to fix the component body 31 to the circuit casing 20C is also allowed in addition to the first fixing portion 41 and the second fixing portion 42.

A method of fixing and conducting the connection terminals to the circuit board 21 is not limited to soldering. For example, the connection terminals can be fixed and conducted to the circuit board 21 by press fitting a press-fitting portion formed on the connection terminals into a hole in the circuit board 21.

In the present invention, there is no restriction on a type of the compression mechanism provided in the electric compressor or a type of the motor.

The circuit component provided on the circuit assembly of the present invention is not limited to the capacitor, and may be, for example, a choke coil.

REFERENCE NUMERALS

10 Electric compressor
11 Motor
12 Compression mechanism
11 Housing
14 Shaft
20 Circuit assembly
20C Circuit casing (casing)
21 Circuit board
22 Partition wall
23 Peripheral wall
24 Fixing portion
25 Boss
26 Boss
27 Circuit element
28 Screw
30 Capacitor (circuit component)
31 Component body 31A Power storage unit
31B Resin mold
31C Bottom surface
31D Side surface
31E Side surface
32 Terminal member
32A Connection terminal
32B Terminal
33 Terminal member
33A Connection terminal
33B Terminal
40 Capacitor casing 17
40A Housing portion
40B Opening
41 First fixing portion
42 Second fixing portion
43 Retaining portion
44 Retaining portion
80 Capacitor
82A, 83A Connection terminal
111 Stator
112 Rotor
121 Fixed scroll
122 Orbiting scroll
130 Opening
201 Space
202 Space
210 Hole
801, 802 Fixing portion
D1 Width direction
D2 Direction
L1 Fixed line
P1 Protruding portion
P2 Distal end
X Center of gravity

The invention claimed is:

1. A circuit assembly comprising:
a circuit board;
a circuit component connected to the circuit board; and
a casing configured to house the circuit board and the circuit component;
wherein the circuit component includes
a component body including a pair of connection terminals to be fixed to the circuit board, and
a first fixing portion and a second fixing portion configured to fix the component body to the casing,
the pair of connection terminals are disposed with a fixed line (L) connecting the first fixing portion and the second fixing portion interposed therebetween,
both of the pair of connection terminals each comprise:
a protruding portion (P1) that projects sideward from a side surface (31D) of the component body below the circuit board, the protruding portion (P1) projecting substantially in parallel with the fixed line (L),
a distal end (P2) that continues from the projecting portion (P1) and extends toward the circuit board in a state that the distal end (P2) is bent with respect to the projecting portion (P1), and
the distal ends of the pair of connection terminals are fixed to the circuit board in a vicinity of at least one of the first fixing portion and the second fixing portion.

2. The circuit assembly according to claim 1, wherein both of the pair of connection terminals are disposed along a direction orthogonal to the fixed line in a vicinity of at least one of the first fixing portion and the second fixing portion.

3. The circuit assembly according to claim 1, wherein the pair of connection terminals are disposed along a direction orthogonal to the fixed line,
one of the pair of connection terminals is positioned in a vicinity of one of the first fixing portion and the second fixing portion, and
another one of the pair of connection terminals is positioned in a vicinity of another one of the first fixing portion and the second fixing portion.

4. The circuit assembly according to claim 2, wherein the pair of connection terminals are disposed such that a longitudinal direction of a lateral cross section is set along the direction orthogonal to the fixed line connecting the first fixing portion and the second fixing portion.

5. The circuit assembly according to claim 3, wherein the pair of connection terminals are disposed such that a longitudinal direction of a lateral cross section is set along the direction orthogonal to the fixed line connecting the first fixing portion and the second fixing portion.

6. The circuit assembly according to claim 1, wherein at least one of the first fixing portion and the second fixing portion is fixed to the casing without the circuit board interposed therebetween.

7. The circuit assembly according to claim 1, wherein both of the first fixing portion and the second fixing portion are fixed to the casing without the circuit board interposed therebetween.

8. The circuit assembly according to claim 1, wherein the component body is positioned in a vicinity of an area where the circuit board is fixed to the casing.

9. The circuit assembly according to claim 2, wherein the first fixing portion and the second fixing portion are at different positions in a direction orthogonal to the circuit board along a plate thickness direction.

10. The circuit assembly according to claim 3, wherein the first fixing portion and the second fixing portion are at different positions in a direction orthogonal to the circuit board along a plate thickness direction.

11. The circuit assembly according to claim 1, wherein the pair of connection terminals are disposed symmetrically with respect to the fixed line.

12. The circuit assembly according to claim 1, wherein the circuit component is a capacitor or a choke coil.

13. An electric compressor to be mounted on a vehicle comprising:
the circuit assembly according to claim 1;
a motor to which a driving current is supplied from the circuit assembly; and
a compression mechanism configured to compress a fluid by motive power transmitted from the motor.

14. An electric compressor to be mounted on a vehicle comprising:
the circuit assembly according to claim 2;
a motor to which a driving current is supplied from the circuit assembly; and
a compression mechanism configured to compress a fluid by motive power transmitted from the motor.

* * * * *